United States Patent
Nakaji et al.

(10) Patent No.: US 7,031,587 B2
(45) Date of Patent: Apr. 18, 2006

(54) WAVEGUIDE TYPE PHOTORECEPTOR DEVICE WITH PARTICULAR THICKNESS RATIO

(75) Inventors: Masaharu Nakaji, Tokyo (JP); Eitaro Ishimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/866,700

(22) Filed: Jun. 15, 2004

(65) Prior Publication Data

US 2005/0047743 A1 Mar. 3, 2005

(30) Foreign Application Priority Data

Aug. 25, 2003 (JP) .............................. 2003-300480

(51) Int. Cl.
*G02B 6/10* (2006.01)
(52) U.S. Cl. ..................................... 385/131
(58) Field of Classification Search ................ 385/131, 385/129, 130, 132, 28
See application file for complete search history.

(56) References Cited

U.S. PATENT DOCUMENTS 6,498,873 B1 * 12/2002 Chandrasekhar et al. ..... 385/28

FOREIGN PATENT DOCUMENTS

| JP | 2001-24211 | 1/2001 |
| JP | 2001-168371 | 6/2001 |
| JP | 2002-203984 | 7/2002 |

OTHER PUBLICATIONS

T. Ido, et al., Monday Afternoon, vol 1, OFC 2003, pp. 66-67, "Highly Efficient Lens-Less Coupling of High-Speed Waveguide Photodiode to SMF and Its Application to an Extremely Thin Surface-Mountable 10-GBPS Receiver Module", 2003.

Y. Matsuoka, et al., Extended Abstracts (The 50th Spring Meeting, 2003); The Japan Society of Applied Physics and Related Societies, No. 3, p. 1246, "Properties of $\lambda=1.5$ μm 10GB/S Waveguide PIN-PD", 2003 (with english translation).

U.S. Appl. No. 10/777,136, filed Feb. 13, 2004, unknown.

* cited by examiner

*Primary Examiner*—Frank G. Font
*Assistant Examiner*—Timothy Rude
(74) *Attorney, Agent, or Firm*—Oblon, Spivak, McClelland, Maier & Neustadt, P.C.

(57) ABSTRACT

A waveguide type photoreceptor device of the present invention comprises a waveguide 16a disposed on a Fe-doped InP substrate, the waveguide including an n-cladding layer connected to an n-electrode, an n-light guide layer, a light absorption layer, a p-light guide layer, and a p-cladding layer connected to a p-electrode, laminated onto one another over the Fe-doped InP substrate, and the ratio of the layer thickness of the thicker one of the n-light guide layer and the p-light guide layer to that of the thinner one being between 1.3 and 5 both inclusive.

10 Claims, 3 Drawing Sheets

WAVEGUIDE TYPE PHOTORECEPTOR DEVICE WITH PARTICULAR THICKNESS RATIO

BACKGROUND OF THE INVENTION

1. Field of the Invention

The present invention relates to a waveguide type photoreceptor device, and more particularly to a waveguide type photoreceptor device used for optical communications systems, etc.

2. Description of the Related Art

The capacity of communications systems has been increased to satisfy the dramatically increasing demand for communications. Accordingly, there has been a need for higher-speed, higher-efficiency yet lower-cost and smaller optical communications devices.

The transmission systems for optical communications use two types of signal light having different wavelength bands (or signal light with two wavelength bands). One is a 1.3 µm (wavelength) band signal light whose center wavelength is 1.3 µm, and the other is a 1.55 µm (wavelength) band signal whose center wavelength is 1.55 µm.

The 1.55 µm band signal light causes only a small optical fiber loss and therefore is used for long-distance communication systems. This type of communication is referred to as the intercity communication (trunk system) and used for communications between large cities such as Tokyo and Osaka.

The 1.3 µm band signal light, on the other hand, causes a large optical fiber loss but exhibits a low wavelength dispersion level and therefore is used for short-distance communication systems. This type of communication is referred to as the intracity communication and used for communications within large cities. The 1.3 µm band signal light is also used for communications between each base station and homes. Such a system is referred to as an access system.

To receive these two types of signal light having the different wavelength bands (or signal light with the two wavelength bands), optical communication systems have used two waveguide type semiconductor photodiodes each adapted for signal light with one of the wavelength bands.

A well-known example of a conventional waveguide type photoreceptor device is configured such that an n conductive type InGaAsP light guide layer, an intrinsic InGaAs light absorption layer, a p conductive type InGaAsP light guide layer, and a p conductive type InP cladding layer are sequentially laminated onto one another over an n conductive type InP substrate (n conductive type, p conductive type, and intrinsic semiconductor are hereinafter expressed as "n-n", "p-", and "i-", respectively). The n-InGaAsP light guide layer has a thickness of 1.7 µm and a bandgap wavelength of 11.3 µm, while the p-InGaAsP light guide layer has a thickness of 0.3 µm and a bandgap wavelength of 1.3 µm (see, for example, paragraphs [0024] to [0026] and FIG. 1 of Japanese Laid-Open Patent Publication No. 2001-24211).

Another well-known example (a waveguide type semiconductor photoreceptor device used for optical communications systems) is configured such that a waveguide mesa made up of an n-InP cladding layer, an $n^+$-InAlGaAs guide layer, an i-InGaAs light absorption layer, a $p^+$-InAlGaAs guide layer, a $p^+$-InP cladding layer, and a $p^+$-InGaAs contact layer is formed on a semi-insulative InP substrate. The $n^+$-InAlGaAs guide layer has a layer thickness of 0.8 µm, the i-InGaAs light absorption layer has a layer thickness of 0.5 µm, and the $p^+$-InAlGaAs guide layer has a layer thickness of 0.1 µm (see, for example, paragraph [0003] and FIG. 13 of Japanese Laid-Open Patent Publication No. 2002-203984).

Still another well-known example (a 1.5-µm band 10-Gb/s waveguide type PIN-PD used for optical communications networks having a communication capacity on the order of gigabits or more) is of a mesa type having an InGaAlAs double core structure and includes a light absorption layer of $In_{0.53}Ga_{0.47}As$. See, for example, "Characteristics of 1.5-µm Band 10-Gb/s Waveguide Type PIN-PD", Manuscript for the $50^{th}$ Lecture Meeting of the Japan Society of Applied Physics, Kanagawa University, pp. 1246, 27p-H-15, Spring 2003.

Conventional waveguide type photoreceptor devices are each configured of a photodiode adapted for signal light with a single wavelength band used by a target optical communications system. With an increase in the amount of transmission in optical communications systems, however, a communications network currently established for intracity communication may also be used for intercity communication. In such a case, the above conventional arrangement in which optical components (such as photoreceptor devices) are adapted only for a single wavelength complicates the configuration of each communication device in optical communications systems.

Furthermore, optical components such as waveguide type photodiodes (hereinafter referred to as waveguide type PDs) adapted for signal light with a single wavelength have been difficult to operate at high speed with high sensitivity when they receive signal light with two wavelengths.

A waveguide type PD has a structure in which light is confined within the waveguide portion made up of a light absorption layer and light guide layers sandwiching the light absorption layer, and the light confined within the waveguide portion is absorbed and converted into an electric signal while the light is propagating through the light guide layers and the light absorption layer.

Since the waveguide type PD confines light within its waveguide portion and absorbs it by utilizing the differences between the refractive indices of the light absorption layer, the light guide layers, and the cladding layer, the appropriate refractive index of each layer varies depending on the wavelength of the signal light which the waveguide type PD is designed to receive.

The device structure of a waveguide type PD for a single wavelength band can be optimized according to the wavelength band of the light to be received. A waveguide type PD for more than one wavelength, however, may have a problem in that it may have good sensitivity characteristics at one wavelength but have very bad sensitivity characteristics at another wavelength. It may even happen that the waveguide type PD has undesirable sensitivity characteristics over the entire wavelength band.

For example, since increasing the differences between the refractive indices of the light guide layers and the cladding layers increases the amount of light confined within the waveguide, it may be a good idea to set the light guide layers such that they have as long a composition wavelength as possible selected from among those at which the bandgap signal light can transmit through the light guide layers.

To accommodate more than one wavelength, however, the light guide layers must have a composition wavelength at which signal light with the shortest wavelength band can transmit through them.

If the composition wavelength of the light guide layers is determined based on a wavelength in the shortest wavelength band of the signal light, the sensitivity of the waveguide type PD for the other wavelength bands may considerably degrade.

If the n-light guide layer and the p-light guide layer sandwiching the light absorption layer have the same layer thickness (that is, these guide layers are symmetrical to each other about the light absorption layer), the mode of the light propagating within the waveguide stabilizes and thereby the amount of light propagating through the light guide layers increases, causing the problem of reduced photoelectric conversion efficiency. To solve this problem, the light guide layers may be set to have different layer thicknesses (they may be set asymmetrical to each other about the light absorption layer). Even with such a waveguide structure in which the light guide layers are asymmetrical to each other about the light absorption layer, however, a waveguide type PD for more than one wavelength may have very bad sensitivity characteristics at some wavelength through it may have good sensitivity characteristics at a different wavelength. Furthermore, with a simple asymmetrical waveguide structure, the waveguide type PD may have degraded sensitivity characteristics even for signal light with a single wavelength band in some cases.

Thus, it is difficult to form a waveguide type PD having a waveguide structure in which the light guide layers are asymmetrical to each other about the light absorption layer in such a way that the waveguide type PD can operate at high speed with high sensitivity for both (signal light with) a first wavelength band and (signal light with) a second wavelength band (or another wavelength band) at the same time. In some cases, such a waveguide type PD is difficult to operate at high speed with high sensitivity even when it receives signal light with a single wavelength.

SUMMARY OF THE INVENTION

The present invention has been devised to solve the above problems. It is, therefore, a first object of the present invention to provide a waveguide type photoreceptor device whose light guide layers are asymmetrical to each other about the light absorption layer and which can operate at high speed with high sensitivity.

According to one aspect of the invention, there is provided a waveguide type photoreceptor device comprising: a semi-insulative semiconductor substrate; and an optical waveguide layer disposed on said semiconductor substrate, having a first cladding layer of a first conductive type connected to a first electrode, a first light guide layer of the first conductive type, a light absorption layer, a second light guide layer of a second conductive type, and a second cladding layer of the second conductive type connected to a second electrode laminated onto one another over said semiconductor substrate in that order, wherein the ratio of the layer thickness of the thicker one of the first light guide layer and the second guide layer to that of the thinner one is between 1.3 and 5 both inclusive.

Accordingly, A waveguide type photoreceptor device of the present invention can operate at high speed while exhibiting high light reception sensitivity for signal light with predetermined signal light wavelength bands, making it possible to easily provide a waveguide type photoreceptor device whose light reception sensitivity is high for signal light with predetermined signal light wavelength bands and which can operate at high speed.

Hence, there can be constructed simplify optical communications systems, allowing their capacity to be increased at low cost.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

A waveguide type photoreceptor device according to a preferred embodiment of the present invention will be described below using as an example a 40-Gbps buried waveguide type PIN-PD for 1.3-μm and 1.55-μm bands used as a photoreceptor device for optical communications systems.

First Embodiment

Figure 1:
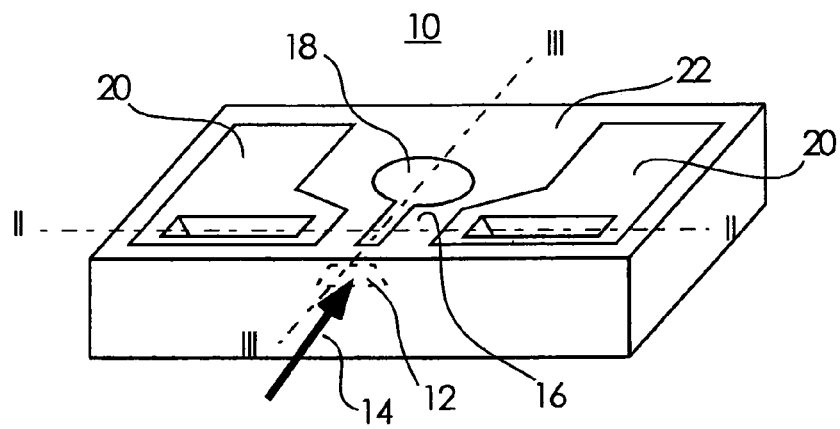
FIG. 1 is a perspective view of a waveguide type photoreceptor device according to an embodiment of the present invention.

FIG. 1 is a perspective view of a waveguide type photoreceptor device according to an embodiment of the present invention.

Referring to FIG. 1, the light receiving portion 12 of the front cleaved end face of a waveguide type PIN-PD 10 receives signal light 14 indicated by the arrow. The signal light 14 has two wavelength bands: a 1.3 μm band (a first signal wavelength band) whose center wavelength $\lambda 1$ is 1.3 μm; and a 1.55 μm band (a second signal wavelength band) whose center wavelength $\lambda 2$ is 1.55 μm.

On the top side of the PIN-PD 10 is disposed a waveguide mesa 16 including a waveguide which receives the signal light through the light receiving portion 12 of the front cleaved end face. A p-electrode 18 is disposed on the top surface of the waveguide mesa 16, while an n-electrode 20 is disposed on both sides of the waveguide mesa 16 and the top surface of the PIN-PD 10. An insulating film 22 coats portions of the top surface other than those on which the p-electrode 18 and the n-electrode 20 are disposed.

Figure 2:
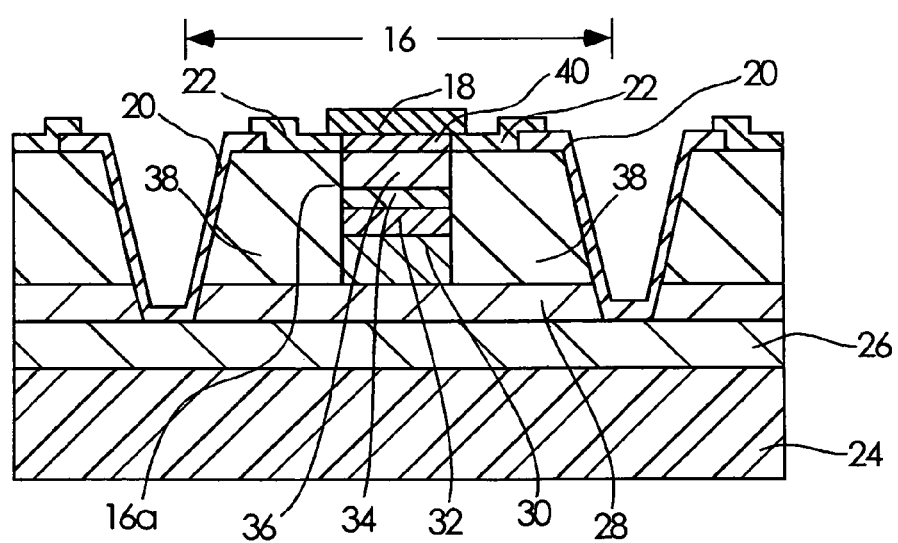
FIG. 2 is a cross-sectional view of the waveguide type photoreceptor device of FIG. 1 taken along line II—II.

FIG. 2 is a cross-sectional view of the waveguide type photoreceptor device of FIG. 1 taken along line II—II, that is, a cross-sectional view as viewed in the signal light traveling direction (the direction of the waveguide).

Figure 3:
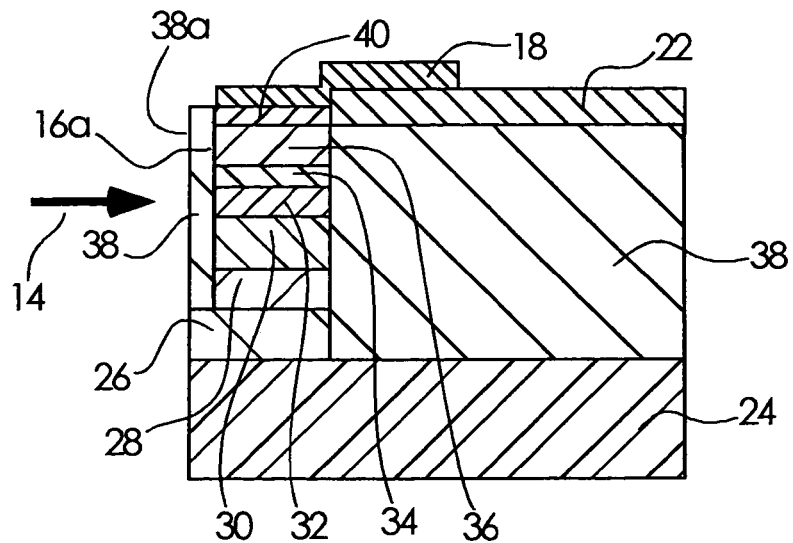
FIG. 3 is a cross-sectional view of the waveguide type photoreceptor device of FIG. 1 taken along line III—III.

FIG. 3, on the other hand, is a cross-sectional view of the waveguide type photoreceptor device of FIG. 1 taken along line III—III, that is, a cross-sectional view as viewed perpendicular to the signal light traveling direction (the direction of the waveguide).

It should be noted that in these figures, like numerals are used to denote like or corresponding components.

Referring to FIG. 2, an n-InGaAs contact layer 26 is formed on a semi-insulative Fe-doped InP substrate 24 (a semi-insulative semiconductor substrate). On the n-contact layer 26 is disposed the waveguide mesa 16 which receives the signal light 14 through the light receiving portion 12.

The waveguide mesa 16 comprises a waveguide 16a and an Fe-doped InP blocking layer 38. The waveguide 16a (an optical waveguide layer) is made up of: an n-InP cladding layer 28 (a first cladding layer) disposed on the surface of the n-contact layer 26; an n-InGaAsP light guide layer 30 (a first light guide layer) disposed on the surface of the center portion of the n-cladding layer 28; an i-InGaAs light absorption layer 32 disposed on the n-light guide layer 30; a p-InGaAsP light guide layer 34 (a second light guide layer) disposed on the surface of the light absorption layer 32; a p-InP cladding layer 36 (a second cladding layer) disposed on the surface of the p-light guide layer 34; and a p-InGaAs contact layer 40 disposed on the surface of the p-cladding layer 36. Thus, these layers are sequentially laminated onto one another. The Fe-doped InP blocking layer 38 (a low refractive index layer) is disposed on both sides of the waveguide 16a other than the p-contact layer 40 and constitutes the sides of the waveguide mesa 16.

The blocking layer 38 disposed on both sides of the waveguide 16a may be formed of a material whose refractive index is lower than that of the light absorption layer 32 to increase the difference between the refractive indices of the blocking layer 38 and the waveguide 16a. This arrangement can increase the light confinement efficiency and thereby enhance the light reception sensitivity of the photoreceptor device.

Furthermore, the p-electrode 18 is disposed on the surface of the p-contact layer 40, and the n-electrode 20 is disposed such that it covers both sides of the blocking layer 38 and is in contact with the surface of the n-contact layer 26. The insulating film 22 is disposed on the portion of the surface of the waveguide mesa 16 not covered with the p-electrode 18 and the n-electrode 20. Thus, the p-electrode 18 and the n-electrode 20 are electrically separated from each other by the insulating film 22.

Referring now to FIG. 3, the Fe-doped InP blocking layer 38 having a cleaved end face 38a is disposed on the light receiving side (the front end) of the waveguide 16a. The Fe-doped InP blocking layer 38 is also disposed on the rear side of the waveguide 16a. That is, the waveguide 16a is buried in the Fe-doped InP blocking layer 38, and the wafer is cleaved at the blocking layer 38 to produce a chip. The waveguide 16a receives signal light through the light receiving portion 12 of the cleaved end face of the blocking layer 38.

According to the present embodiment, the length of the waveguide 16a in the longitudinal direction, that is, the light traveling direction is 16 µm. The layer thicknesses of the n-cladding layer 28 and the p-cladding layer 36 are set to 1.5 µm and 0.8 µm, respectively. The layer thicknesses of the n-light guide layer 30 and the p-light guide layer 34 are set to 0.70 µm and 0.35 µm, respectively. Thus, the light guide layers have different layer thicknesses (they are asymmetrical to each other about the light absorption layer 32). The ratio of the layer thickness of the n-light guide layer 30 (the thicker light layer) to that of the p-light guide layer 34 is 2.0.

When the waveguide has an asymmetrical structure with respect to the light absorption layer as described above, the mode of the light propagating within the waveguide becomes asymmetrical. As a result, the light is diffused to the light absorption layer and thereby the amount of light absorbed by the light absorption layer increases, making it possible to provide a waveguide type photoreceptor device having high sensitivity over a wide wavelength band.

The wavelength band can be widened by reducing the carrier travel time. However, since the light absorption layer 32 absorbs less light with decreasing thickness, it is appropriate that the layer thickness $d_a$ of the light absorption layer 32 is set such that 0.3 µm $\leq d_a \leq$ 0.5 µm. According to the present embodiment, $d_a$ is set such that $d_a$=0.5 µm.

InP used as material for the n-cladding layer 28 and the p-cladding layer 36 has a composition wavelength (λa) of 0.92.

Further, the composition wavelength λg of InGaAsP used as material for the n-light guide layer 30 and the p-light guide layer 34 is set such that it is larger than the refractive index (0.92) of the material of the n-cladding layer 28 and the p-cladding layer 36 and furthermore the light guide layers are transparent with respect to a 1.3 µm band light, that is, λa<λg<λ1, or preferably λa<λg<0.965 λ1. According to the present embodiment, InGaAsP having a composition wavelength (λg) of 1.2 µm is used.

The n type impurities added in each n type layer are Group IV elements such as Si and S, while the p type impurities added in each p type layer are Group II elements such as Be and Zn. No impurities are added in the light absorption layer 32, which is an intrinsic semiconductor layer.

The impurity concentration of each layer is set as follows. The n-contact layer 26 has an impurity concentration of $5\times10^{18}$ cm$^{-3}$; the n-cladding layer 28, $5\times10^{17}$ cm$^{-3}$; the n-light guide layer 30, $5\times10^{17}$ cm$^{-3}$; the p-light guide layer 34, $5\times10^{15}$ cm$^{-3}$ to $5\times10^{17}$ cm$^{-3}$ (changed stepwise); the p-cladding layer 36, $1\times10^{18}$ cm$^{-3}$; and the p-contact layer 40, $1\times10^{19}$ cm$^{-3}$.

Therefore, in the waveguide 16a, the p-light guide layer 34, the n-light guide layer 30, and the light absorption layer 32 sandwiched between them form a p/i/n junction.

A brief description will be made below of a method for manufacturing the PIN-PD 10.

First of all, the n-InGaAs contact layer 26, the n-InP cladding layer 28, the n-InGaAsP light guide layer 30, the i-InGaAs light absorption layer 32, the p-InGaAsP light guide layer 34, the p-InP cladding layer 36, and the p-InGaAs contact layer 40 are laminated onto one another over the semi-insulative Fe-doped InP substrate 24 in that order. These layers are formed by a chemical vapor deposition method, for example, the MOCVD method such that they have predetermined thicknesses.

Then, an SiO$_2$ film is formed on the surface of the p-InGaAs contact layer 40, which is the top layer among these laminated layers, producing an (SiO$_2$) insulating film pattern such that an insulating film is formed on the portion corresponding to the top surface of the waveguide 16a to be formed and furthermore an opening is formed therearound. This insulating pattern is used as a mask to form the waveguide 16a. At that time, etching is carried out stepwise. Specifically, the etching is (partially) stopped when the n-InP cladding layer 28 has been fully exposed, forming the front and both side portions of the waveguide 16a. Then, the etching is (completely) stopped when the InP substrate 24 has been exposed, forming the rear portion of the waveguide 16a.

The damaged layers formed at the time of the dry etching are removed by wet etching, and the waveguide 16a is buried in Fe-doped InP through burying growth, forming the blocking layer 38.

Then, after forming an insulating film, the waveguide mesa 16 is formed by wet etching. After that, the n-electrode 20, the insulating film 22, and the p-electrode 18 are formed.

After that, the rear surface of the InP substrate 24 is etched to an appropriate depth and a rear metal for bonding is formed, completing the wafer process.

In the above PIN-PD 10 designed for both a 1.3 μm band and a 1.55 μm band, the layer thicknesses of the n-light guide layer 30 and the p-light guide layer 34 are set to 0.70 μm and 0.35 μm, respectively, as described above. Description will be made below of how to determine the layer thicknesses of the n-light guide layer 30 and the p-light guide layer 34.

We conducted a simulation for signal light with the two wavelengths 1.3 μm and 1.55 μm, as follows. The length of the waveguide 16a in the longitudinal direction was set to 16 μm and the sum of the layer thicknesses of the n-light guide layer 30 and the p-light guide layer 34 was set to 1.05 μm. With other device parameters set to certain values, we obtained the dependence of the sensitivity on the layer thicknesses of the light guide layers for each signal light wavelength by use of BPM (beam propagation method) when the layer thickness of the p-light guide layer 34 was changed from 0.1 μm to 0.525 μm.

Figure 4:
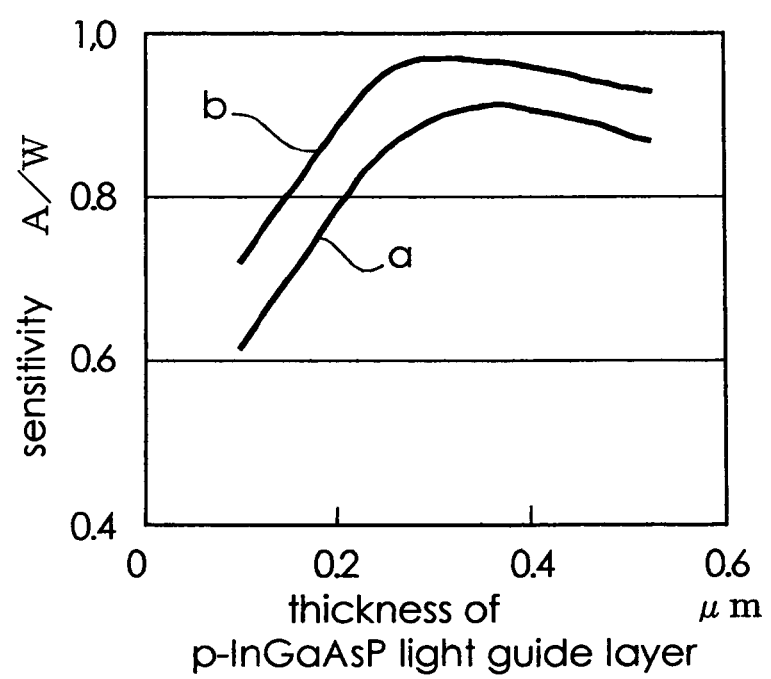
FIG. 4 is a graph showing how the sensitivity of the waveguide type photoreceptor device of the present embodiment depends on the thicknesses of the light guide layers.

FIG. 4 is a graph showing how the sensitivity of the waveguide type photoreceptor device of the present embodiment depends on the thicknesses of the light guide layers. In the figure, curve a represents the dependence of the sensitivity on the thickness of the p-light guide layer for light with the wavelength 1.3 μm, while curve b represents the dependence of the sensitivity on the thickness of the p-light guide layer for light with the wavelength 1.55 μm.

In both cases, as the layer thickness of the p-light guide layer increases from 0.1 μm, the sensitivity increases until each maximum value is reached and then the sensitivity slightly decreases, as indicated by curves a and b in FIG. 4.

The sensitivity for the light with the wavelength 1.3 μm indicated by curve a is maximized when the layer thickness of the p-light guide layer is approximately 0.35 μm; the maximum sensitivity value is approximately 0.9 A/W.

The sensitivity for the light with the wavelength 1.55 μm indicated by curve b, on the other hand, is maximized when the layer thickness of the p-light guide layer is approximately 0.3 μm; the maximum sensitivity value is approximately 0.95 A/W.

These maximum sensitivity values are equal to or higher than those of a photoreceptor device configured such that the optical waveguide has a symmetrical structure in which the light guide layers sandwiching the light absorption layer have the same thickness and the layer thickness of the n- or p-light guide layer is optimized for light with the wavelengths 1.3 μm and 1.55 μm.

Let d1 and d2 denote the layer thicknesses of the p-light guide layer and the n-light guide layer (d2≧d1) in μm, respectively, and r denote the ratio of d2 to d1 (r=d2/d1). In such a case, since d2+d1=1.05 μm, the value of r changes with the layer thickness d1 of the p-light guide layer, as follows. In FIG. 4, when the layer thickness d1 of the p-light guide layer is 0.1 μm, r=9.5; when d1 is 0.2 μm, r=4.25; when d1 is 0.3 μm, r=2.5; when d1 is 0.4 μm, r=1.625; and when d1 is 0.5 μm, r=1.1.

If a specification requires a sensitivity level of 0.7 A/W or more, the value of r must be set such that 1.3≦r≦5 (that is, 0.46 μm≧d1≧0.175 μm). Preferably, the value of r may be set such that 1.625≦r≦3.2 (that is, 0.4 μm≧d1≧0.25 μm), which will produce a photoreceptor device having high sensitivity for light with both wavelengths 1.55 μm and 1.3 μm. According to the present embodiment, r is set to 2.0, which is within the above range.

It should be noted that according to the present embodiment, the sum of the layer thicknesses of the n-light guide layer 30 and the p-light guide layer 34 is set to 1.05 μm (and a simulation is carried out using this value). However, the sum of the layer thicknesses need not necessarily be set to this particular value. For example, the same effect can be obtained when the sum of the layer thicknesses of the n-light guide layer 30 and the p-light guide layer 34 is set to any value between 0.9 and 1.2 μm.

Figure 5:
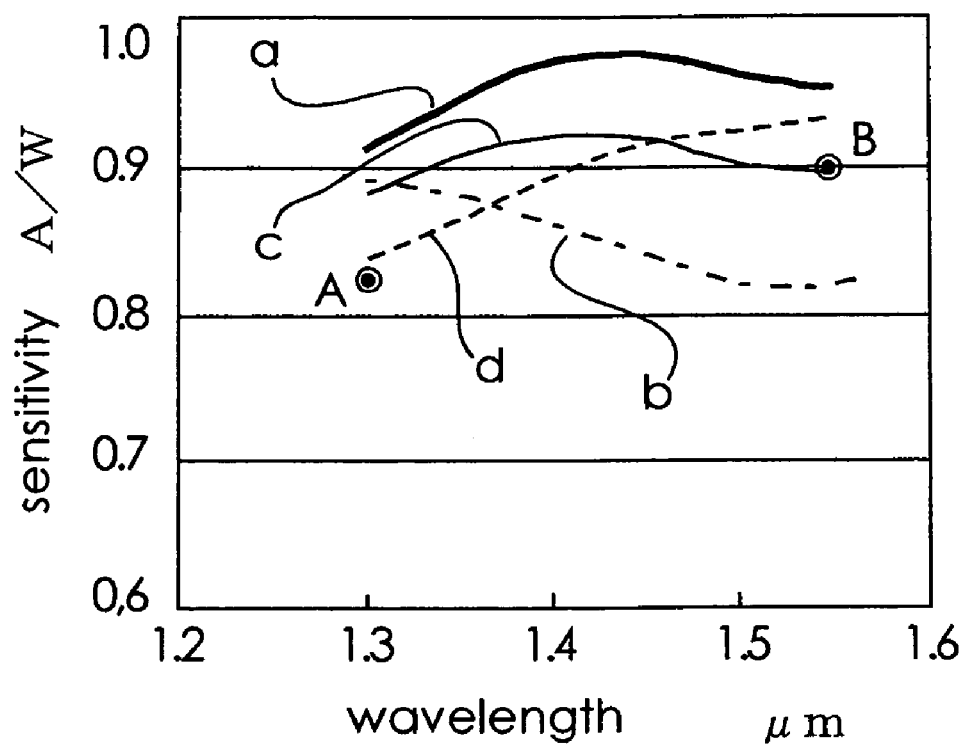
FIG. 5 is a graph showing how the sensitivity of the waveguide type photoreceptor device of the present embodiment depends on the wavelength of received light.

FIG. 5 is a graph showing how the sensitivity of the waveguide type photoreceptor device of the present embodiment depends on the wavelength of received light.

For comparison, FIG. 5 also shows how the sensitivity of a waveguide type photoreceptor device in which the n-light guide layer and the p-light guide layer sandwiching the light absorption layer have the same layer thickness depends on the wavelength of received light.

In the figure, curve a is the sensitivity curve of the waveguide type photoreceptor device according to the present invention in which the layer thicknesses of the p-light guide layer and the n-light guide layer are respectively set to 350 nm (0.35 μm) and 700 nm (0.70 μm), that is, r=2.

The curve was obtained by calculating the sensitivity of the photoreceptor device when the wavelength of the incident light is changed from 1.3 μm to 1.55 μm.

Curves b, c, and d are sensitivity curves (with respect to the wavelength of the received light) of the waveguide type photoreceptor device in which the n-light guide layer and the p-light guide layer sandwiching the light absorption layer have the same layer thickness. Specifically, curve b indicates the sensitivity when the layer thicknesses of the p-light guide layer and the n-light guide layer are both set to 400 nm (0.4 μm); curve c indicates the sensitivity when the thicknesses are set to 500 nm (0.5 μm); and curve d indicates the sensitivity when the thicknesses are set to 600 nm (0.6 μm).

The sensitivity represented by curve b is maximized when the wavelength of the incident light is 1.3 μm within this wavelength range (from 1.3 μm to 1.55 μm), and the sensitivity decreases with increasing wavelength.

The sensitivity represented by curve c is maximized when the wavelength of the incident light is 1.4 μm, and the sensitivity decreases as the wavelength increases or decreases from this value.

The sensitivity represented by curve d is maximized when the wavelength of the incident light is 1.55 μm within this wavelength range, and the sensitivity decreases with decreasing wavelength.

The sensitivity represented by curve a is higher than those represented by curves b, c, and d over the entire wavelength range from 1.3 μm to 1.55 μm.

Further, points A and B indicate measured values of the sensitivity of an experimentally produced photoreceptor device in which the layer thicknesses of the p-light guide layer and the n-light guide layer are set to 350 nm (0.35 μm) and 700 nm (0.70 μm), respectively. Specifically, point A indicates the sensitivity value for light with the wavelength 1.3 μm (it is approximately 0.82). Point B indicates the sensitivity value for light with the wavelength 1.55 μm (it is approximately 0.9). As can be appreciated from these two measured sensitivity values indicated by points A and B, the calculated sensitivity values approximately coincide with the measured sensitivity values. That is, a single photoreceptor device can have high sensitivity for multiwavelength signal light with the wavelengths 1.3 μm and 1.55 μm.

Thus, the n-light guide layer 30 and the p-light guide layer 34 sandwiching the light absorption layer 32 are set to have different layer thicknesses (these guide layers are asymmetrical to each other about the light absorption layer 32). Furthermore, the ratio of the layer thickness of the n-light guide layer to that of the p-light guide layer, denoted by r, is set such that $1.3 \leq r \leq 5$, preferably $1.625 \leq r \leq 3.2$. With this arrangement, it is possible to provide a waveguide type photoreceptor device having high sensitivity for multiwavelength signal light with the wavelengths 1.3 μm and 1.55 μm.

It should be noted that in the above simulation, the layer thickness of the p-light guide layer is decreased to provide an asymmetrical structure in which the light guide layers are asymmetrical to each other about the light absorption layer. However, the layer thickness of the n-light guide layer may be decreased to provide such an asymmetrical structure, producing the same results and effects.

The present embodiment was described using as an example a waveguide type photoreceptor device having high sensitivity for multiwavelength signal light with the wavelengths 1.3 μm and 1.55 μm. However, as can be seen from FIG. 5, the photoreceptor device having the waveguide structure in which the light guide layers are asymmetrical to each other about the light absorption layer has higher sensitivity than the photoreceptor device having the waveguide structure in which the light guide layers are symmetrical to each other about the light absorption layer, and the sensitivity of the former is maximized at a wavelength of 1.4 μm. This means that the waveguide type photoreceptor device having the asymmetrical waveguide structure has high sensitivity for both single-wavelength signal light and multiwavelength signal light.

Therefore, the ratio of the layer thickness of the n-light guide layer to that of the p-light guide layer, denoted by r in FIG. 4, may be set such that $1.3 \leq r \leq 5$, preferably $1.625 \leq r \leq 3.2$ to provide a photoreceptor device having high sensitivity for single-wavelength signal light.

The present invention was described as applied to a buried waveguide type PIN-PD formed of InGaAsP material. However, AlInGaAsP material or GaInNAs material may be used instead of InGaAsP material.

Since these materials are mixed crystals made up of a plurality of elements, their lattice constant and bandgap can be changed, allowing the bandgap to be changed over a very wide range using the same substrate material and lattice constant. This makes it possible to increase the degree of freedom in design and provide a photoreceptor device having higher sensitivity.

InGaAsP materials have been studied and developed over the years. They are now the most common materials for photoreceptor devices for communications and provide stable characteristics.

On the other hand, photoreceptor devices may be formed using AlInGaAsP materials such that the cladding layers, the light guide layers, and the light absorption layer are formed of, for example, InAlAs, InGaAlAs, and InGaAs, respectively, to obtain a predetermined refractive index difference, producing the same effect.

Further, GaInNAs materials may be used to form photoreceptor devices. Their composition ratio may be changed so as to obtain a predetermined refractive index difference and produce the same effect.

PDs formed of GaInNAs materials can provide a wider range of bandgap wavelengths than PDs formed of InGaAsP materials or AlInGaAsP materials.

As described above, the waveguide type PIN-PD of the present embodiment is configured such that the n-light guide layer 30 and the p-light guide layer 34 sandwiching the light absorption layer 32 are set to have different layer thicknesses (these guide layers are asymmetrical to each other about the light absorption layer 32). Furthermore, the ratio of the layer thickness of the thicker one of the p-light guide layer and the n-light guide layer to that of the thinner one, denoted by r, is set such that $1.3 \leq r \leq 5$, preferably $1.625 \leq r \leq 3.2$. With this arrangement, it is possible to provide a waveguide type photoreceptor device having high sensitivity for multiwavelength signal light with the wavelengths 1.3 μm and 1.55 μm. Such a waveguide type photoreceptor device can operate at high speed while exhibiting high light reception sensitivity for multiband signal light with a 1.3 μm band and a 1.55 μm band. Thus, it is possible to easily provide a waveguide type photoreceptor device which can operate at high speed with high light reception sensitivity for signal light with a plurality of wavelength bands. This can simplify optical communications systems, allowing their capacity to be increased at low cost.

Thus, the photoreceptor device of the present embodiment has a waveguide structure in which the light guide layers are asymmetrical to each other about the light absorption layer. Furthermore, the ratio of the layer thickness of the thicker one of the p-light guide layer and the n-light guide layer to that of the thinner one, denoted by r, is set such that $1.3 \leq r \leq 5$, preferably $1.625 \leq r \leq 3.2$. Such a photoreceptor device has higher sensitivity than photoreceptor devices having a waveguide structure in which the light guide layers are symmetrical to each other about the light absorption layer. It has higher sensitivity even for single-wavelength signal light. Therefore, it is possible to provide a photoreceptor device having high sensitivity for single-wavelength signal light as well as multiwavelength signal light.

Further, according to the present embodiment, the thickness $d_a$ of the light absorption layer is set such that $0.3 \mu m \leq d_a \leq 0.5 \mu m$. This leads to a reduced carrier travel time and widened wavelength band, making it possible to easily provide a wideband photoreceptor device. As a result, it is possible to widen the bandwidth of communications systems as well as easily increasing their capacity.

Still further, the photoreceptor device of the present embodiment is configured such that the waveguide has formed on its sides an Fe-doped InP blocking layer which has a lower refractive index than the i-InGaAs light absorption layer. This arrangement can increase the light confinement efficiency and thereby enhance the light reception sensitivity of the photoreceptor device, making it possible to provide a waveguide type PIN-PD having a simple structure and exhibiting high light reception sensitivity.

Still further, the photoreceptor device of the present embodiment described above is configured such that the light guide layers sandwiching the light absorption layer have different layer thicknesses (they are asymmetrical to each other about the light absorption layer) to make asymmetrical the mode of the light propagating within the waveguide and thereby increase the sensitivity. However, the waveguide may be configured such that the light guide layers sandwiching the light absorption layer have different refractive indices to produce the same effect. Furthermore, the waveguide may be configured such that the light guide layers sandwiching the light absorption layer have different layer thicknesses and different refractive indices, also producing the same effect.

The present embodiment was described using as an example a PIN-PD. However, the present invention may also be applied to photoreceptor devices which amplify a received signal therein, such as devices having a function to amplify an electric signal converted from received light (for example, avalanche photodiodes (APDs) having an intensifying layer therein), and photoreceptor devices having on the front face of its light receiving portion an SOA (semiconductor optical amplifier) which has a function to amplify a light signal. These photoreceptor devices can also produce the same effect.

AlInGaAsP materials are especially used to produce APDs. An APD formed of AlInGaAsP produces low noise when amplifying a signal, as compared to an APD formed of InGaAsP materials, making it possible to form an APD having high light reception sensitivity.

It goes without saying that modules containing the above photoreceptor devices can also produce the same effect.

Thus, the waveguide type photoreceptor device of the present invention is useful as an optical communication device for optical communications systems such as networks for intracity communications and networks for intercity communications. Particularly, the present invention is advantageous when applied to waveguide type photoreceptor devices which must operate at high speed with high sensitivity in optical communications systems using signal light with a plurality of wavelength bands.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A waveguide type photoreceptor device comprising:
   a semi-insulative semiconductor substrate; and
   an optical waveguide layer connected between first and second electrodes and disposed on said semiconductor substrate, having a first cladding layer of a first conductive type, a first light guide layer of the first conductive type, a light absorption layer, a second light guide layer of a second conductive type, and a second cladding layer of the second conductive type laminated onto one another over said semiconductor substrate in that order,
   wherein the ratio of the layer thickness of the thicker one of the first light guide layer and the second guide layer to that of the thinner one is between 1.3 and 5 both inclusive,
   wherein the composition wavelength of the first light guide layer and the second light guide layer is less than 1.3 μm and longer than that of the first cladding layer and second cladding layer, and
   wherein the sum of the layer thickness of the first light guide layer and the second light guide layer is set to any value between 0.9 and 1.2 μm.

2. The waveguide type photoreceptor device according to claim 1, wherein the thickness of the light absorption layer is set such that $0.3 \, \mu m \leq d_a \leq 0.5 \, \mu m$, where $d_a$ denotes the thickness of the light absorption layer.

3. The waveguide type photoreceptor device according to claim 2, wherein said optical waveguide layer receives signal light with a 1.3 μm wavelength band and a 1.55 μm wavelength band.

4. The waveguide type photoreceptor device according to claims 1, wherein the first and second light guide layers are formed of InGaAsP semiconductor material, AlInGaAsP semiconductor material, or GaInNAs semiconductor material.

5. The waveguide type photoreceptor device according to claim 1, wherein the ratio of the layer thickness of the thicker one of the first light guide layer and the second guide layer to that of the thinner one is between 1.625 and 3.2 both inclusive.

6. The waveguide type photoreceptor device according to claim 5, wherein the thickness of the light absorption layer is set such that $0.3 \, \mu m \leq d_a \leq 0.5 \, \mu m$, where $d_a$ denotes the thickness of the light absorption layer.

7. The waveguide type photoreceptor device according to claim 6, wherein said optical wave guide layer receives signal light with a 1.3 μm wavelength band and a 1.55 μm wavelength band.

8. The waveguide type photoreceptor device according to claim 5, wherein the first and second light guide layers are formed of InGaAsP semiconductor material, AlInGaAsP semiconductor material, or GaInNAs semiconductor material.

9. The waveguide type photoreceptor device according to claim 5, wherein said optical waveguide layer receives signal light with a 1.3 μm wavelength band and a 1.55 μm wavelength band.

10. The waveguide type photoreceptor device according to claim 1, wherein said optical waveguide layer receives signal light with a 1.3 μm wavelength band and a 1.55 μm wavelength band.

* * * * *